(12) United States Patent
Yamaji

(10) Patent No.: US 12,255,620 B2
(45) Date of Patent: Mar. 18, 2025

(54) ELECTRONIC COMPONENT

(71) Applicant: Murata Manufacturing Co., Ltd., Nagaokakyo (JP)

(72) Inventor: Toru Yamaji, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 248 days.

(21) Appl. No.: 17/953,380

(22) Filed: Sep. 27, 2022

(65) Prior Publication Data

US 2023/0017921 A1    Jan. 19, 2023

Related U.S. Application Data

(63) Continuation of application No. PCT/JP2021/011423, filed on Mar. 19, 2021.

(30) Foreign Application Priority Data

Mar. 30, 2020    (JP) .................. 2020-061032

(51) Int. Cl.
*H03H 9/25* (2006.01)
*H01L 23/10* (2006.01)
*H01L 23/31* (2006.01)
*H03H 9/02* (2006.01)
(Continued)

(52) U.S. Cl.
CPC ............. *H03H 9/25* (2013.01); *H01L 23/10* (2013.01); *H01L 23/3114* (2013.01); *H03H 9/02015* (2013.01); *H03H 9/0504* (2013.01); *H03H 9/1007* (2013.01)

(58) Field of Classification Search
CPC .... H03H 9/25; H03H 9/02015; H03H 9/0504; H03H 9/1007; H03H 9/059; H03H 9/1071; H03H 9/0547; H03H 9/0576; H03H 9/1085; H01L 23/10; H01L 23/3114;
(Continued)

(56) References Cited

U.S. PATENT DOCUMENTS 9,660,609 B2    5/2017 Reisner et al.
2008/0186106 A1*    8/2008 Christian ............. H03H 9/1455
    333/133
(Continued)

FOREIGN PATENT DOCUMENTS

JP    2007060465 A    3/2007
JP    2007251391 A    9/2007
JP    2018093057 A    6/2018

OTHER PUBLICATIONS

International Search Report in PCT/JP2021/011423, mailed May 18, 2021, 3 pages.
(Continued)

*Primary Examiner* — Jorge L Salazar, Jr.
(74) *Attorney, Agent, or Firm* — Keating & Bennett, LLP

(57) ABSTRACT

An electronic component includes a mounting substrate, and first and second devices each including a functional element. The first device is spaced apart from and faces the mounting substrate. The second device is located on the mounting substrate and faces the first device. A functional element of the first device is located on a first surface facing the second device, in the first device. A functional element of the second device is located on a second surface facing the first device, in the second device.

19 Claims, 8 Drawing Sheets

(51) Int. Cl.
*H03H 9/05* (2006.01)
*H03H 9/10* (2006.01)

(58) Field of Classification Search
CPC ........... H01L 24/13; H01L 2224/13027; H01L 23/564; H01L 23/315; H01L 23/3121
USPC .......................... 333/133, 186–188, 193–196
See application file for complete search history.

(56) References Cited

U.S. PATENT DOCUMENTS

2017/0346463 A1* 11/2017 Hatakeyama ............ H03H 9/64
2018/0159504 A1    6/2018  Oda

OTHER PUBLICATIONS

Written Opinion in PCT/JP2021/011423, mailed May 18, 2021, 4 pages.

* cited by examiner

ELECTRONIC COMPONENT

CROSS REFERENCE TO RELATED APPLICATIONS

This application claims the benefit of priority to Japanese Patent Application No. 2020-061032 filed on Mar. 30, 2020 and is a Continuation Application of PCT Application No. PCT/JP2021/011423 filed on Mar. 19, 2021. The entire contents of each application are hereby incorporated herein by reference.

BACKGROUND OF THE INVENTION

1. Field of the Invention

The present disclosure relates to an electronic component, and more particularly, to a technique for realizing a reduction in size of a device having a wafer level package (WLP) structure.

2. Description of the Related Art

In recent years, communication using radio-frequency signals in a plurality of frequency bands has been performed in communication devices such as mobile terminals represented by mobile phones and smartphones. When signals in a plurality of frequency bands are processed, a filter for selectively passing a signal in each frequency band is used.

In the mobile terminal as described above, there is still a high demand for a further reduction in size and thickness, and accordingly, there is also a demand for a further reduction in the height of a radio-frequency device such as a filter disposed inside equipment.

U.S. Pat. No. 9,660,609 discloses a duplexer in which two radio-frequency devices (filters) each having a WLP structure are stacked. In the stack-type duplexer disclosed in U.S. Pat. No. 9,660,609, a substrate area for forming the filter can be reduced, so that equipment can be reduced in size.

SUMMARY OF THE INVENTION

As a radio-frequency device having a WLP structure, an acoustic wave device in which an acoustic wave resonator is utilized has been known. It is said that in the acoustic wave device, a hollow space for mechanically vibrating the acoustic wave resonator is required.

When an acoustic wave device is applied to the stack structure disclosed in U.S. Pat. No. 9,660,609, while a planar substrate area can be reduced, it is necessary to secure a space for exciting a resonator, and thus there may be a limit in reducing a dimension in a thickness direction (height direction) of the device. Here, in order to realize a further reduction in height while securing the space for excitation, it is conceivable to form a piezoelectric substrate on which the acoustic wave resonator is formed to be thin. However, since heat capacity of the substrate decreases when the thickness of the substrate is reduced, a substrate temperature increases due to heat generated by excitation of the acoustic wave resonator, and as a result, there is a possibility that electric power handling performance of the device significantly decreases.

Preferred embodiments of the present invention achieve reduction in size and height of electronic components each having a WLP structure while preventing a decrease in electric power handling performance.

An electronic component according to a preferred embodiment of the present disclosure includes a mounting substrate, and first and second devices each including a functional element. The first device is spaced apart from the mounting substrate and faces the mounting substrate. The second device is located on the mounting substrate so as to face the first device. The functional element of the first device is located on a first surface facing the second device, in the first device. The functional element of the second device is located on a second surface facing the first device, in the second device.

In an electronic component according to a preferred embodiment of the present disclosure, the two devices (the first device and the second device) in which the functional elements are included define a stack structure. One device (the second device) is located on the mounting substrate, and another device (the first device) is spaced apart from the mounting substrate. In the respective first device and second device, the functional elements are located on the surfaces facing each other. With such a configuration, a space between the first device and the second device can be shared by the functional elements in the respective devices. Thus, it is possible to reduce a dimension in a thickness direction of the entire equipment without thinning the substrate on which the functional element is provided. Thus, in an electronic component having a WLP structure, it is possible to realize a reduction in size and height while preventing a decrease in electric power handling performance.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
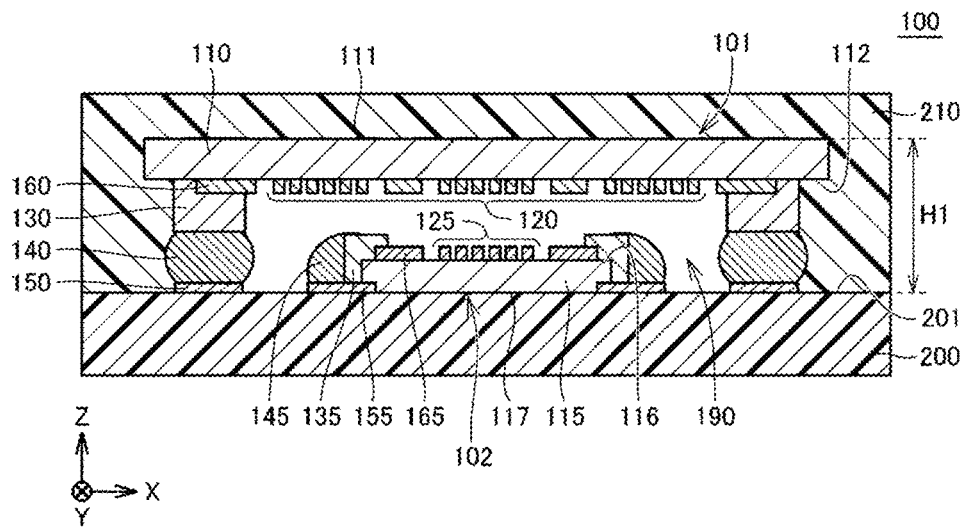
FIG. 1 is a sectional view of an electronic component according to Preferred Embodiment 1 of the present invention.

Hereinafter, preferred embodiments of the present disclosure will be described in detail with reference to the figures. Note that, in the figures, the same or corresponding portions are denoted by the same reference numerals, and description thereof will not be repeated.

Preferred Embodiment 1

FIG. 1 is a sectional view of an electronic component 100 according to Preferred Embodiment 1. Referring to FIG. 1, the electronic component 100 includes a first device 101, a second device 102, and a mounting substrate 200. Each of the first device 101 and the second device 102 has a WLP structure. Note that, in the following description, in the drawings, a positive direction of a Z-axis may be referred to as an upper surface side, and a negative direction may be referred to as a lower surface side.

In Preferred Embodiment 1, each of the first device 101 and the second device 102 is a circuit in which a functional element is included, and specifically is a filter circuit including an acoustic wave resonator. The first device 101 includes a piezoelectric substrate 110, and at least one functional element 120 included on a lower surface 112 of the piezoelectric substrate 110. Further, the second device 102 includes a piezoelectric substrate 115, and at least one functional element 125 included on an upper surface 116 of the piezoelectric substrate 115.

Each of the piezoelectric substrates 110 and 115 is made of, for example, piezoelectric single crystal materials such as lithium tantalate ($LiTaO_3$), lithium niobate ($LiNbO_3$), alumina, silicon (Si), and sapphire, or a piezoelectric laminated material made of $LiTaO_3$ or $LiNbO_3$.

The functional element is an element that extracts a signal in a specific frequency band. Each of the functional elements 120 and 125 includes a pair of comb-shaped interdigital transducer (IDT) electrodes made of, for example, using an electrode material such as a single metal including at least one of aluminum, copper, silver, gold, titanium, tungsten, platinum, chromium, nickel, and molybdenum, or an alloy containing these as a main component. In each of the first device 101 and the second device 102, a surface acoustic wave (SAW) resonator includes the piezoelectric substrate and the IDT electrode.

In the first device 101, on the lower surface 112 of the piezoelectric substrate 110 on which the functional elements 120 are included, a wiring pattern 160 is provided to electrically connect the functional elements 120 to each other, and to electrically connect the functional element 120 to a columnar electrode 130.

The columnar electrode 130 protrude downward (in the negative direction of the Z-axis) from the lower surface 112 of the piezoelectric substrate 110, and is connected and fixed to a connection electrode 150 on the mounting substrate 200 via a solder bump 140. That is, the first device 101 is supported on the mounting substrate 200 by the solder bump 140 and the columnar electrode 130, and a hollow space 190 is defined by the first device 101 and the mounting substrate 200.

The second device 102 is disposed in the hollow space 190 defined by the first device 101 such that a lower surface 117 is in contact with the mounting substrate 200. Note that, an adhesive layer may be provided between the second device 102 and the mounting substrate 200. In the second device 102, on the upper surface 116 of the piezoelectric substrate 115 on which the functional elements 125 are located, a wiring pattern 165 is provided to electrically connect the functional elements 125 to each other, and electrically connect the functional element 125 to a connection electrode 135 on a side surface of the piezoelectric substrate 115. The connection electrode 135 is connected and fixed to a connection electrode 155 on the mounting substrate 200 by a solder bump 145. That is, the electronic component 100 has a stack structure in which the functional element 120 in the first device 101 is positioned so as to face the second device 102, and the functional element 125 in the second device 102 is positioned so as to face the first device 101.

An outer side portion of the first device 101 and an outer side portion of a support body (the columnar electrode 130 and the solder bump 140) supporting the first device 101 is covered with a sealing member 210 to seal the first device 101 and the second device 102. The sealing member 210 is made of, for example, a material obtained by mixing an inorganic filler such as metal into a highly water-repellent material such as a silicon compound, an epoxy-based resin, a silicon-based resin, a fluorine-based resin, or an acrylic resin. By making the sealing member 210 with such a material, moisture resistance and impact resistance of the electronic component 100 can be enhanced.

Figure 2:
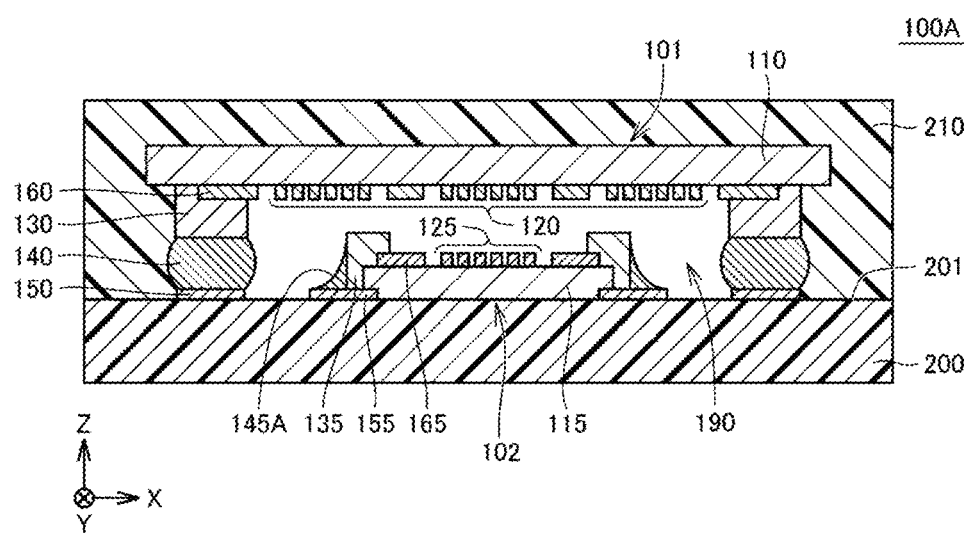
FIG. 2 is a diagram for explaining a modified example of bonding members.

Note that, in FIG. 1, the example is illustrated in which a spherical solder ball is used to connect the connection electrode 135 and the connection electrode 155, but the connection electrode 135 and the connection electrode 155 may be connected using a creamy solder paste 145A as in an electronic component 100A of a modified example illustrated in FIG. 2.

As described above, each of the electronic components 100 and 100A according to Preferred Embodiment 1 is a duplexer including the first device 101 and the second device 102 each defining the filter circuit including the acoustic wave resonator. Such a duplexer is applicable to, for example, communication devices such as mobile terminals represented by mobile phones and smartphones, and is used to separate a transmission signal and a reception signal.

In such a mobile terminal, there is still a high demand for further reduction in size and thickness, and accordingly, there is also a demand for further reduction in size and height of a radio-frequency device such as a filter disposed inside equipment. In response to such a demand, a configuration has been proposed in which two devices (filters) are arranged in a stack structure to reduce a circuit area on a mounting substrate, as illustrated in a comparative example in FIG. 3.

Figure 3:
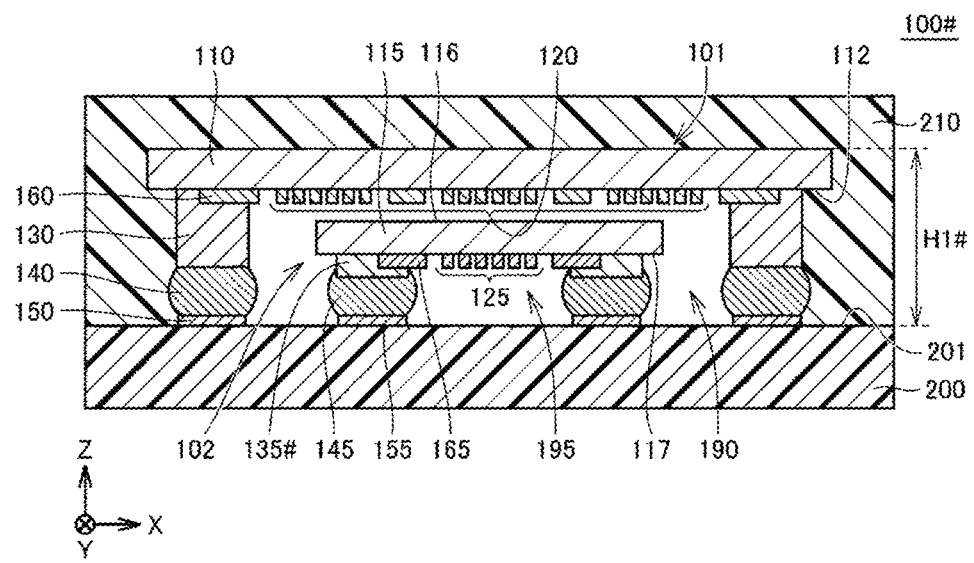
FIG. 3 is a sectional view of an electronic component of a comparative example.

FIG. 3 is a sectional view of an electronic component 100# of the comparative example. Referring to FIG. 3, similarly to the electronic component 100 of Preferred Embodiment 1, the electronic component 100# is also arranged in a stack structure in which the second device 102 is disposed in the hollow space 190 formed between first device 101 and the mounting substrate 200. However, in the case of the electronic component 100# of the comparative example, a configuration is adopted in which the second device 102 is supported above the mounting substrate 200 by a columnar electrode 135# and the solder bump 145 in the same manner as the first device 101. In other words, the functional element 125 in the second device 102 is located on the lower surface 117 of the piezoelectric substrate 115, and is located in a hollow space 195 between the piezoelectric substrate 115 and the mounting substrate 200. That is, the functional element 125 is positioned so as not to face the functional element 120 of the first device 101, but to face the mounting substrate 200.

In the case of the configuration of the comparative example, in particular, an interval between the second device 102 and the mounting substrate 200 cannot be narrowed to a predetermined dimension or less, due to a restriction of a size of the solder bump 145. In addition, for the functional element 120 of the first device 101, it is also necessary to secure a predetermined distance or more, between the piezoelectric substrate 115 of the second device 102 and the functional element 120 of the first device 101. Thus, as a result, it may be necessary to set an interval between the first device 101 and the mounting substrate 200 to a predetermined dimension or more. That is, in the configuration of the comparative example, there is a limit in a reduction in height of the entire equipment.

With respect to such a problem, it is conceivable to reduce a dimension of the entire equipment by reducing a thickness of a piezoelectric substrate of each device. However, since heat capacity of the substrate decreases when the thickness of the piezoelectric substrate is reduced, a substrate temperature increases due to heat generated by operation of a functional element, and as a result, there is a possibility that electric power handling performance of the device significantly decreases. Further, when the thickness of the piezoelectric substrate is reduced, strength of the substrate itself is decreased, and thus, there is a possibility that the piezoelectric substrate is broken when each component is handled in a manufacturing process of the electronic component.

On the other hand, in the configuration of Preferred Embodiment 1, the second device 102 is located so as to be in contact with the mounting substrate 200, and the second device 102 and the mounting substrate 200 are connected to each other on a side surface of the second device 102, and thus, the restriction on the interval between the second device 102 and the mounting substrate 200 is relaxed. Furthermore, since the second device 102 is located in the hollow space 190 of the first device 101, and the functional element 120 and the functional element 125 are positioned so as to face each other, a space between the first device 101 and the second device 102 can be shared by the functional element 120 and the functional element 125, and thus it is not necessary to secure an individual hollow space for each device. Thus, in the electronic component 100 of Preferred Embodiment 1, a distance from the mounting substrate 200 to each of the first device 101 and the second device 102 can be reduced, compared to the electronic component 100# of the comparative example. Accordingly, a distance H1 from an upper surface 201 of the mounting substrate 200 to an upper surface 111 of the first device 101 in the electronic component 100 of Preferred Embodiment 1 can be made shorter than a distance H1# from the upper surface 201 of the mounting substrate 200 to the upper surface 111 of the first device 101 in the electronic component 100# of the comparative example, and as a result, it is possible to realize a reduction in height and high electric power handling capability of the entire equipment.

Note that, the "solder bump 140" and the "solder bump 145" in Preferred Embodiment 1 respectively correspond to a "first bonding member" and a "second bonding member". The "connection electrode 150" and the "connection electrode 155" in Preferred Embodiment 1 respectively correspond to a "first electrode" and a "second electrode". The "lower surface 112" of the piezoelectric substrate 110 and the "upper surface 116" of the piezoelectric substrate 115 in Preferred Embodiment 1 respectively correspond to a "first surface" and a "second surface".

Preferred Embodiment 2

In Preferred Embodiment 1, the configuration has been described in which the functional element 120 of the first device and the functional element 125 of the second device 102 are exposed in the hollow space 190 between the first device 101 and the mounting substrate 200. In Preferred Embodiment 2, a configuration will be described in which a configuration in which a hollow space is provided for each device is separately provided, and a functional element is located in the hollow space.

Figure 4:
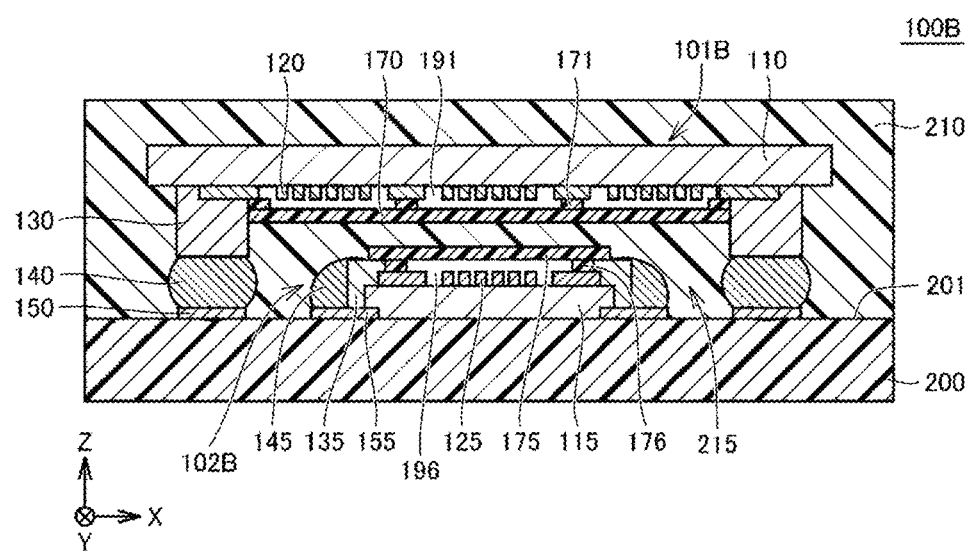
FIG. 4 is a sectional view of an electronic component according to Preferred Embodiment 2 of the present invention.

FIG. 4 is a sectional view of an electronic component 100B according to Preferred Embodiment 2. Referring to FIG. 4, in the electronic component 100B, in addition to the configuration of the electronic component 100 of Preferred Embodiment 1, a cover portion that covers a functional element is added to each of the first device 101 and the second device 102. Specifically, the first device 101 further includes a cover portion 170 and a plurality of support portions 171 made of an insulating material. The support portion 171 is located on the lower surface 112 of the piezoelectric substrate 110, or on the wiring pattern 160 located on the lower surface 112 of the piezoelectric substrate 110, so as to protrude downward (in the negative direction of the Z-axis). Then, the cover portion 170 is positioned so as to be supported by the support portion 171. A hollow space 191 is defined between the cover portion 170 and the piezoelectric substrate 110, by the cover portion 170 and the support portion 171. The functional element 120 of the first device 101 is located in the hollow space 191 defined by the cover portion 170 and the piezoelectric substrate 110.

Similarly, the second device 102 further includes a cover portion 175 and a plurality of support portions 176 made of an insulating material. The support portion 176 is located on the upper surface 116 of the piezoelectric substrate 115, or on the wiring pattern 165 located on the upper surface 116 of the piezoelectric substrate 115, so as to protrude upward (in the positive direction of the Z-axis). Then, the cover portion 175 is positioned so as to be supported by the support portion 176. A hollow space 196 is defined between the cover portion 175 and the piezoelectric substrate 115, by the cover portion 175 and the support portion 176. The functional element 125 of the second device 102 is located in the hollow space 196 defined by the cover portion 175 and the piezoelectric substrate 115.

Note that, a portion between the first device 101 and the second device 102 may be left hollow, or may be filled with a sealing member 215. The sealing member 215 may be made of the same material as that of the sealing member 210 covering an outer periphery of the first device 101, or may be made of a different material.

As described above, by providing the configuration to define the hollow space for each device in which the functional element is included, a degree of freedom in selecting a sealing method can be increased. Furthermore, even when force in a Z-axis direction due to sealing acts on each device and deformation occurs, direct contact between the functional element of the first device and the functional element of the second device is prevented, and thus mold resistance can be improved.

Note that, the configuration of the electronic component 100B has been described in which the cover portion is provided in each of the first device 101 and the second device 102, but a configuration may be adopted in which a cover portion is provided in either one of the first device 101 and the second device 102. In this case, the sealing member 215 is not used.

Preferred Embodiment 3

In Preferred Embodiment 3, a configuration will be described in which a shield structure is located on the cover portion described in Preferred Embodiment 2.

Figure 5:
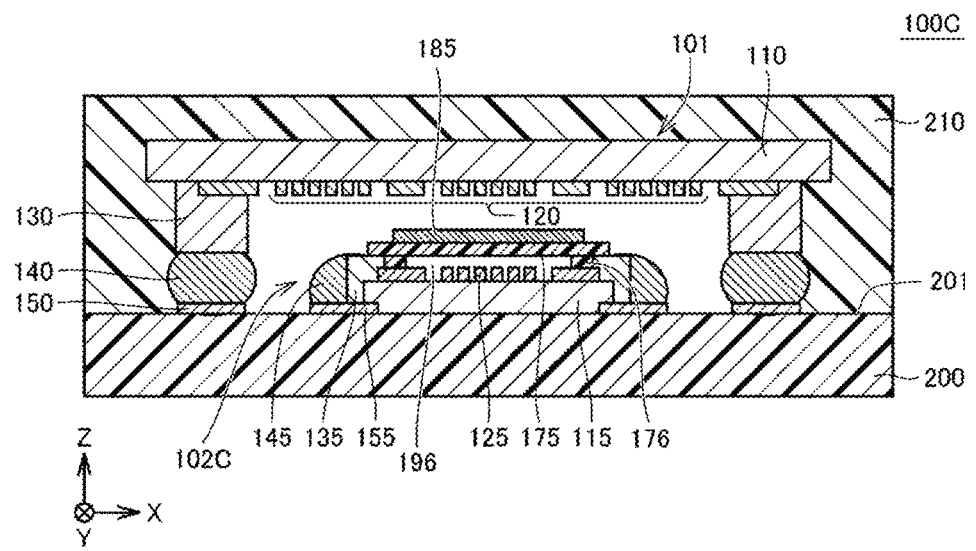
FIG. 5 is a sectional view of an electronic component according to Preferred Embodiment 3 of the present invention.

FIG. 5 is a sectional view of an electronic component 100C according to Preferred Embodiment 3. Referring to FIG. 5, in the electronic component 100C, the cover portion 175 described in Preferred Embodiment 2 is included in the second device 102, and a shield layer 185 made of a conductor is located on an upper surface (surface facing the first device 101) of the cover portion 175. Although not illustrated in FIG. 5, the shield layer 185 is connected to a ground potential.

By providing such a shield layer 185, an electromagnetic field that may be generated by the functional element 125 of the second device 102 is blocked. Thus, since it is possible to prevent electromagnetic field coupling between the functional element 120 of the first device 101 and the functional element 125 of the second device 102, it is possible to prevent a decrease in filter characteristics due to the electromagnetic field coupling.

Note that, although FIG. 5 illustrates the example in which the cover portion is located only on a side of the second device 102, a configuration may be adopted in which a cover portion is located only on a side of the first device 101, and a shield layer is located on the cover portion. Further, as illustrated in FIG. 4, the cover portion may be provided on each of the first device 101 and the second device 102. When the cover portion is provided on each of the devices, it is sufficient that a shield layer is provided on at least one of the cover portions.

Preferred Embodiment 4

In each of the above-described preferred embodiments, the configuration has been described in which the first device and the second device are provided on the mounting substrate, which is flat. In Preferred Embodiment 4, a configuration will be described in which a second device is provided in a concave portion located in a mounting substrate.

Figure 6:
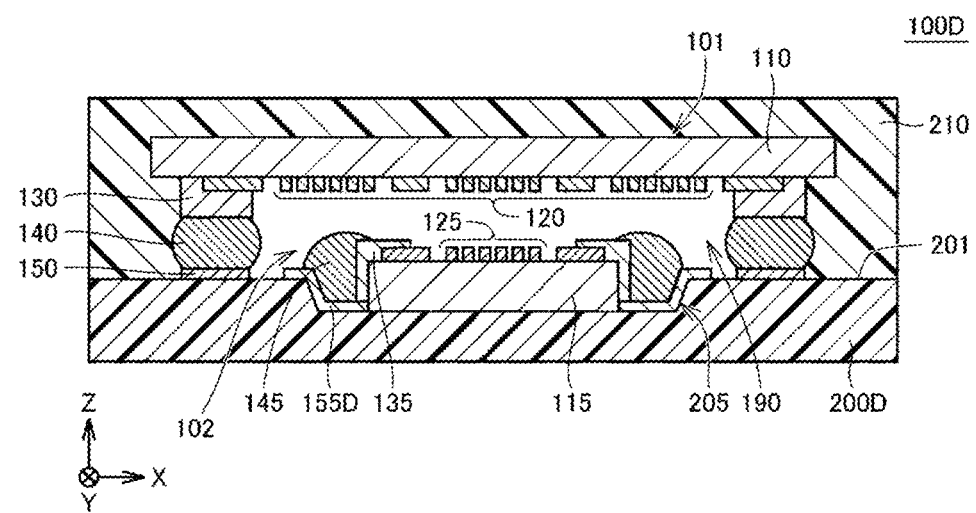
FIG. 6 is a sectional view of an electronic component according to Preferred Embodiment 4 of the present invention.

FIG. 6 is a sectional view of an electronic component 100D according to Preferred Embodiment 4. Referring to FIG. 6, in the electronic component 100D, the first device 101 and the second device 102 are located on a mounting substrate 200D instead of the mounting substrate 200. The first device 101 is supported on the mounting substrate 200D by the columnar electrode 130 and the solder bump 140 in the same manner as in the above-described preferred embodiments.

In the mounting substrate 200D, a concave portion 205 is located in a portion of a surface facing the functional element 120 in the first device 101 (that is, an upper surface facing the hollow space 190). The concave portion 205 is sized to allow at least the second device 102 to be located therein. Then, a connection electrode 155D extends from a bottom surface of the concave portion 205 through a wall portion to the upper surface 201 of the mounting substrate 200D. That is, a distance in the Z-axis direction in at least a portion of the connection electrode 155D to the first device 101 is longer than a distance in the Z-axis direction from the connection electrode 150 for the first device 101 to the first device 101.

The second device 102 is located in the above-described concave portion 205. Then, the connection electrode 135 on a side surface of the second device 102 and the connection electrode 155D on the bottom surface of the concave portion 205 are connected by the solder bump 145, thus the second device 102 is fixed to the mounting substrate 200D.

With such a configuration, as compared with the case of the electronic component 100 of Preferred Embodiment 1, it is possible to shorten a distance from the upper surface 201 of the mounting substrate 200D to an upper end of the second device 102, and thus it is possible to secure an interval between the functional element 120 and the functional element 125. As a result, electromagnetic field coupling between the functional element 120 and the functional element 125 is relaxed. Alternatively, when the interval between the functional element 120 and the functional element 125 is made equivalent to that of the electronic component 100, an interval between the mounting substrate 200D and the first device 101 can be shortened, thus a dimension in the Z-axis direction of the entire equipment can be reduced, and a further reduction in height can be realized. In addition, since the distance between the functional element 120 and the functional element 125 is increased, a thickness of a piezoelectric substrate can be increased. Accordingly, since damage to the device due to handling in a manufacturing process is prevented, it is possible to improve handling properties.

Furthermore, since the second device 102 is provided in the concave portion 205, which is fixed, it is possible to improve positioning accuracy of the second device 102 on the mounting substrate 200D. Accordingly, it is possible to prevent an electrical failure caused by a "solder spreading" in which the solder bump 140 of the first device 101 and the solder bump 145 of the second device 102 come into contact with each other, in accordance with a positional shift of the second device 102.

Note that, a modified example of the configuration for suppressing the positional shift of the second device 102 is illustrated in each of FIG. 7 and FIG. 8 below.

Modified Example 1

Figure 7:
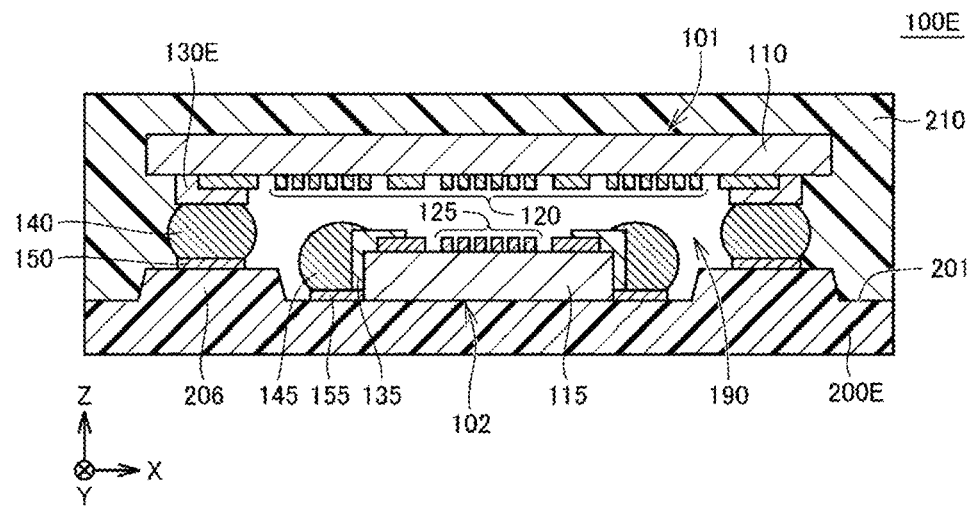
FIG. 7 is a sectional view of an electronic component according to Modified Example 1.

FIG. 7 is a sectional view of an electronic component 100E according to Modified Example 1. Referring to FIG. 7, a plurality of convex portions 206 protruding upward (in the positive direction of the Z-axis) from the upper surface 201 of a mounting substrate 200E is provided on the mounting substrate 200E in the electronic components 100E, and a columnar electrode 130E and the solder bump 140 to support the first device 101 are formed on the convex portion 206. Note that, since an upper surface of the convex portion 206 on which the connection electrode 150 is provided is raised to be higher than the upper surface 201 of the mounting substrate 200E, a dimension in the Z-axis direction of the columnar electrode 130E is shorter than a dimension of the columnar electrode 130 in the electronic component 100 of Preferred Embodiment 1.

Also in the electronic component 100E of Modified Example 1, a distance in the Z-axis direction from the connection electrode 155 for the second device 102 to the first device 101 is longer than a distance in the Z-axis direction from the connection electrode 150 for the first device 101 to the first device 101.

The second device 102 is located in a region surrounded by the convex portions 206 in the mounting substrate 200E. In the electronic component 100E of Modified Example 1, since the convex portion 206 defines and functions as a guide for the second device 102, it is possible to prevent a positional shift of the second device 102.

In addition, as described above, a dimension of a conductive member (the columnar electrode+the solder bump) in a support portion of the first device 101 is shortened by the convex portion 206. Accordingly, since an inductance component of the support portion can be reduced, it is possible to reduce influence of the inductance component on filter characteristics.

Modified Example 2

Figure 8:
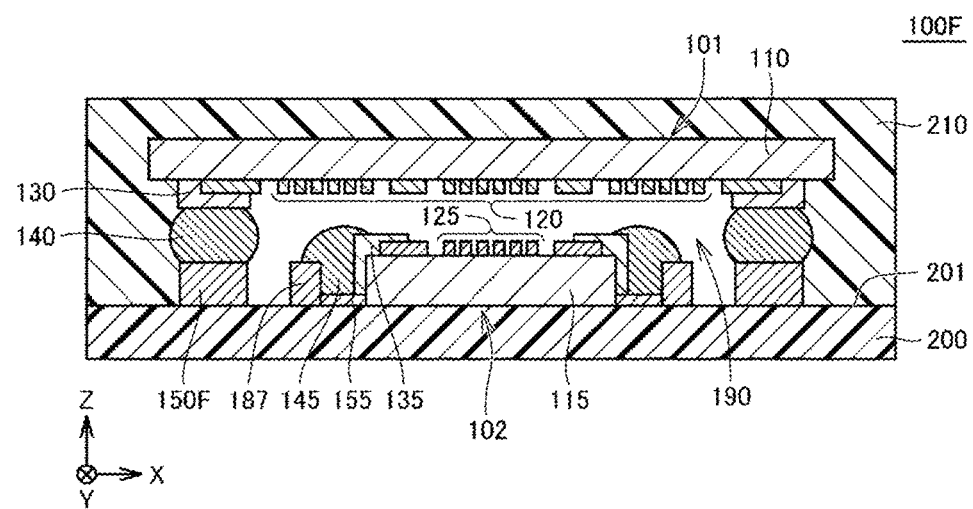
FIG. 8 is a sectional view of an electronic component according to Modified Example 2.

FIG. 8 is a sectional view of an electronic component 100F according to Modified Example 2. Referring to FIG. 8, in the electronic component 100F, the mounting substrate 200 is used that has a flat surface as in Preferred Embodiment 1. However, in the hollow space 190 between the first device 101 and the mounting substrate 200, a positioning member 187 to position the second device 102 is provided on the mounting substrate 200. The positioning member 187 is formed on the mounting substrate 200 by copper (Cu) plating, for example. In a manufacturing process of the electronic component 100F, the second device 102 can be located at a predetermined position by positioning the second device 102 in accordance with the positioning member 187.

Note that, in the example of the electronic component 100F illustrated in FIG. 8, a dimension in the Z-axis direction of a connection electrode 150F to which the solder bump 140 is connected is set to be the same as a dimension in the Z-axis direction of the positioning member 187. In this way, the positioning member 187 can be formed, in a manufacturing process of the electronic component 100F, simultaneously in a process of forming the connection electrode 150F on the mounting substrate 200. Thus, in Modified Example 2, positioning accuracy can be improved without an increase in cost due to addition of a new process.

Also in the electronic component 100F of Modified Example 2, a distance in the Z-axis direction from the connection electrode 155 for the second device 102 to the first device 101 is longer than a distance in the Z-axis direction from the connection electrode 150F for the first device 101 to the first device 101.

Preferred Embodiment 5

In the preferred embodiments described above, the second device is located in a region between the first device and the mounting substrate. Thus, the second device is likely to be filled with heat generated by the functional element, and a temperature of the piezoelectric substrate is likely to rise. As described above, when the temperature rises, the electric power handling performance of the device decreases, which may cause a decrease in characteristics of the device, and a failure or damage of the device.

Thus, in Preferred Embodiment 5, a configuration will be described in which a heat dissipation mechanism of a second device is provided on a mounting substrate to prevent or reduce a decrease in electric power handling performance of the device.

Figure 9:
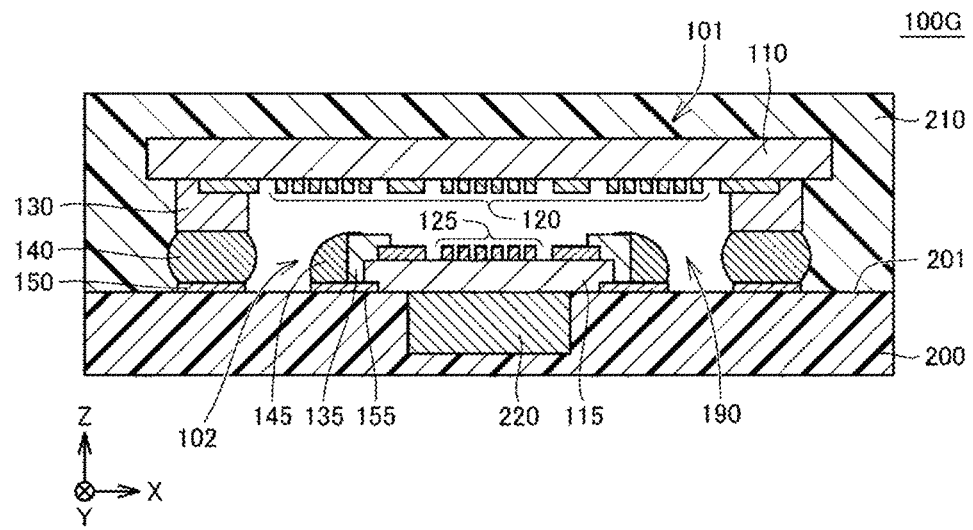
FIG. 9 is a sectional view of an electronic component according to Preferred Embodiment 5 of the present invention.

FIG. 9 is a sectional view of an electronic component 100G according to Preferred Embodiment 5. The electronic component 100G has a configuration in which a metal layer 220 is located between the second device 102 and the mounting substrate 200, in addition to the electronic component 100 of Preferred Embodiment 1. The metal layer 220 is positioned so as to be in contact with the piezoelectric substrate 115 of the second device 102. The metal layer 220 is made of an s-metal having a thermal conductivity higher than that of the mounting substrate 200, and for example, copper, aluminum, or the like, is used. By disposing such a metal layer 220, heat generated in the second device 102 is quickly transferred to the metal layer 220, and dissipated to the mounting substrate 200. Note that, heat dissipation efficiency can be further improved by extending the metal layer 220 to a portion of the mounting substrate 200 where a heat generation portion is small.

Note that, the metal layer 220 is not limited to a configuration of a conductive member having a rectangular parallelepiped shape as illustrated in FIG. 9, and may have a configuration in which a plurality of conductive vias connected to a ground potential is disposed, for example.

Preferred Embodiment 6

The electronic components in the above-described preferred embodiments have the configuration in which the second device positioned so as to be in contact with the mounting substrate is located in the hollow space between the first device and the mounting substrate. In this case, the bonding member (solder bump) to fix the second device to the mounting substrate is also located in the hollow space. In this case, since the bonding members for the first device and the bonding members for the second device are densely disposed in a narrow region, it is necessary to form the wiring patterns, on the mounting substrate, connected to the bonding members so as to be close to each other. Thus, a degree of freedom in wiring design on the mounting substrate may be greatly restricted. In addition, when the bonding members are positioned so as to be close to each other, and solder is melted, a "solder spreading" occurs due to melting expansion of the solder, and there is a high possibility that a short circuit occurs between electrodes.

Thus, in Preferred Embodiment 6, a configuration will be described in which by devising disposition of bonding members of a first device and a second device, the bonding members of the two devices are prevented from being densely disposed.

Figure 10:
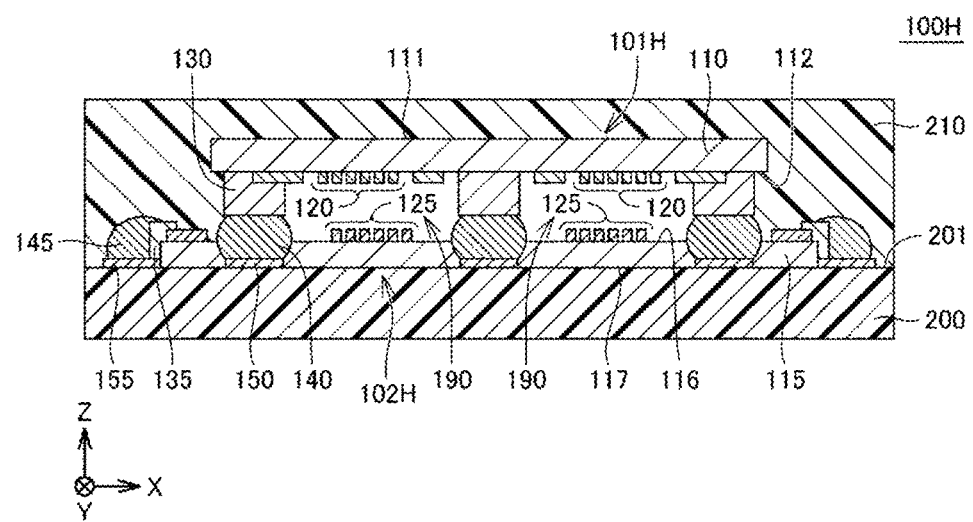
FIG. 10 is a sectional view of an electronic component according to Preferred Embodiment 6 of the present invention.
Figure 11:
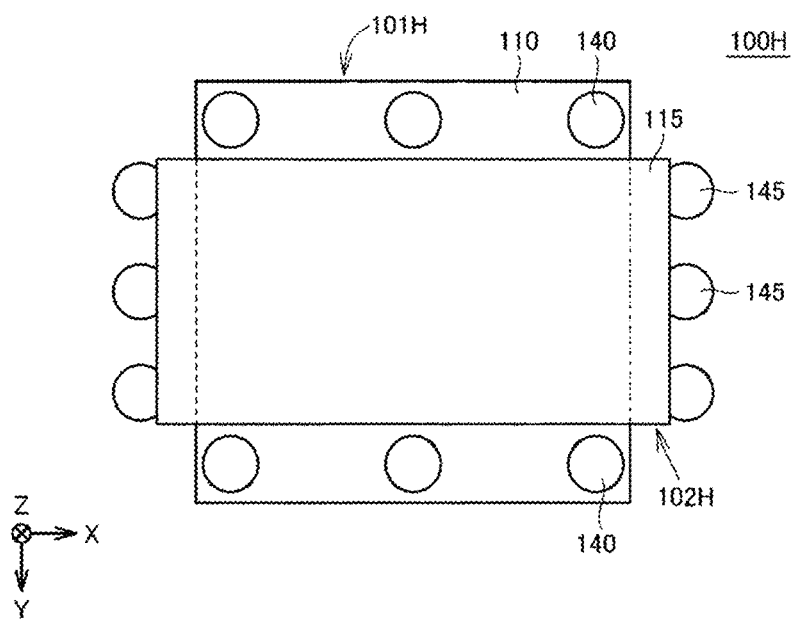
FIG. 11 is a plan view of the electronic component in FIG. 10.

FIG. 10 is a sectional view of an electronic component 100H according to Preferred Embodiment 6. Further, FIG. 11 is a plan view of the electronic component 100H in FIG. 10 as viewed from a lower surface (in the negative direction of the Z-axis). Note that, in the plan view of FIG. 11, the mounting substrate 200 is omitted for ease of explanation.

Referring to FIG. 10, the electronic component 100H includes a first device 101H and the second device 102H. Similarly to the electronic component 100 of Preferred Embodiment 1, a second device 102H is positioned such that the lower surface 117 is in contact with the mounting substrate 200. The second device 102H is fixed to the mounting substrate 200 by connecting the connection electrode 135 on a side surface of the second device 102H to the connection electrode 155 on the upper surface 201 of the mounting substrate 200 with the solder bump 145. In addition, the first device 101H is supported by a support body including the columnar electrode 130 and the solder bump 140, and is spaced apart from the second device 102H in the positive direction of the Z-axis. Then, the hollow space 190 is provided between the first device 101H and the second device 102H.

In the piezoelectric substrate 110 of the first device 101H, the functional element 120 is located on the lower surface 112 facing the hollow space 190. In addition, in the piezoelectric substrate 115 of the second device 102H, the functional element 125 is located on the upper surface 116 facing the hollow space 190.

Referring to FIG. 11, the first device 101H and the second device 102H each preferably have a rectangular or substantially rectangular shape in plan view of the electronic component 100H in a normal direction of the mounting substrate 200. Each of the first device 101H and the second device 102H has a side parallel or substantially parallel to an X-axis direction (first direction) and a side parallel or substantially parallel to a Y-axis direction (second direction). The first device 101H and the second device 102H are positioned such that a center of the piezoelectric substrate 110 of the first device 101H and a center of the piezoelectric substrate 115 of the second device 102H overlap each other.

A dimension in the X-axis direction of the first device 101H is smaller than a dimension in the X-axis direction of the second device 102H. On the other hand, a dimension in the Y-axis direction of the second device 102H is smaller than a dimension in the Y-axis direction of the first device 101H. In other words, the side parallel to the X-axis direction in the first device 101H is located outside the side parallel to the X-axis direction in the second device 102H. Further, the side parallel to the Y-axis direction in the second device 102H is located outside the side parallel to the Y-axis direction in the first device 101H.

Then, the solder bumps 140 of the first device 101H are positioned along the side parallel or substantially parallel to the X-axis direction of the first device 101H. On the other hand, the solder bumps 145 of the second device 102H are positioned along the side parallel or substantially parallel to the Y-axis direction of the second device 102H.

As described above, in each of the rectangular shaped first device 101H and second device 102H, by disposing the solder bumps (bonding members) along one side positioned outside the side of the other device, it is possible to secure distances between the solder bumps 140 of the first device 101H and the solder bumps 145 of the second device 102H, and to reduce density of the solder bumps. As a result, the occurrence of a solder spreading can be reduced or prevented, and troubles caused by electrical contact between the solder bumps can be reduced or prevented.

In addition, as illustrated in FIG. 11, in plan view of the electronic components 100H, solder bumps are not provided where the piezoelectric substrate 110 of the first device 101H and the piezoelectric substrate 115 of the second device 102H overlap each other. Thus, in each piezoelectric substrate, a region in which the functional element and the wiring pattern can be located can be expanded, and thus a degree of freedom of wiring can be improved.

APPLICATION EXAMPLES

Figure 12:
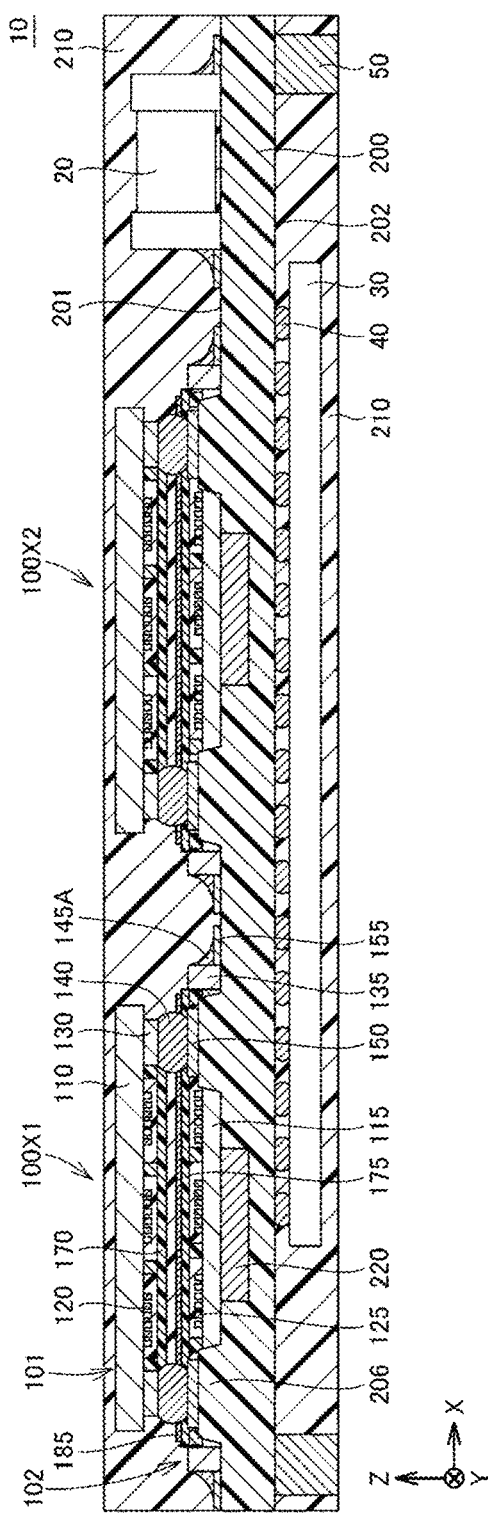
FIG. 12 is a diagram illustrating an example of modularization of the above-described electronic component.

FIG. 12 is a diagram illustrating an example of a radio-frequency device 10 in which electronic components 100X1 and 100X2 to which the features of the preferred embodiments described above are applied are modularized. The radio-frequency device 10 is typically a front-end circuit of a communication device.

Referring to FIG. 12, the radio-frequency device 10 includes the mounting substrate 200, the electronic components 100X1, 100X2, a chip component 20, and an integrated circuit (IC) 30. The electronic components 100X1, 100X2, and the chip component 20 are mounted on the upper surface 201 of the mounting substrate 200. The integrated circuit 30 is mounted on a lower surface 202 of the mounting substrate 200 by solder bumps 40.

Further, a columnar electrode 50 for connection to an external device is provided on the lower surface 202 of the mounting substrate 200. The upper surface 201 and the lower surface 202 of the mounting substrate 200 are molded by the sealing members 210.

The chip component 20 is an individual component such as a transformer, an inductor, or a capacitor, for example. The integrated circuit 30 is a circuit to supply radio-frequency signals to each of the electronic components 100X1 and 100X2, and/or to process radio-frequency signals received from each of the electronic components 100X1 and 100X2.

Each of the electronic components 100X1 and 100X2 is a component having functions similar to those of the above-described preferred embodiments, and has a configuration in which two devices including functional elements are stacked.

The electronic component 100X1 has a configuration including the features of Preferred Embodiment 1, Preferred Embodiment 2, Preferred Embodiment 3, Modified Example 1 of Preferred Embodiment 4, Preferred Embodiment 5, and Preferred Embodiment 6 described above. To be specific, the electronic component 100X1 includes the second device 102 on the mounting substrate 200, and the first device 101 positioned so as to face the second device 102 and to be separated from the mounting substrate 200. The first device 101 is supported by the connection electrode 150 on the convex portion 206 on the upper surface 201 of the mounting substrate 200, via the columnar electrode 130 and the solder bump 140. The first device 101 includes the piezoelectric substrate 110, a plurality of the functional elements 120, and the cover portion 170. The plurality of functional elements 120 is positioned on a surface of the piezoelectric substrate 110 facing the second device 102. The cover portion 170 covers the plurality of functional elements 120. The functional element 120 is located in a hollow space between the piezoelectric substrate 110 and the cover portion 170.

The second device 102 includes the piezoelectric substrate 115, a plurality of the functional elements 125, and the cover portion 175. The piezoelectric substrate 115 is positioned so as to be in contact with the mounting substrate 200. The plurality of functional elements 125 is located on a surface of the piezoelectric substrate 115 facing the first device 101. The cover portion 175 covers the plurality of functional elements 125. The functional element 125 is located in a hollow space between the piezoelectric substrate 115 and the cover portion 175. In the second device 102, the shield layer 185 including a conductive member is disposed on an upper surface side of the cover portion 175. Additionally, the metal layer 220 for heat dissipation is located between the piezoelectric substrate 115 and the mounting substrate 200.

The piezoelectric substrate of each of the first device 101 and the second device 102 has a rectangular or substantially rectangular shape having a side parallel or substantially parallel to the X-axis and a side parallel to the Y-axis in plan view in a normal direction of the electronic component 100X1. The side parallel or substantially parallel to the X-axis of the piezoelectric substrate 110 of the first device 101 is located outside the side parallel to the X-axis of the piezoelectric substrate 115 of the second device 102. In addition, the side parallel or substantially parallel to the Y-axis direction of the piezoelectric substrate 115 of the second device 102 is located outside the side parallel or substantially parallel to the Y-axis direction of the piezoelectric substrate 110 of the first device 101. The second device 102 is fixed on the mounting substrate 200, by connecting the connection electrode 135 on a side surface of the side of the piezoelectric substrate 115 parallel to the Y-axis to the connection electrode 155 on the mounting substrate 200 with the solder paste 145A. Further, the solder bumps 140 supporting the first device 101 are positioned along the side of the piezoelectric substrate 110 parallel to the X-axis.

Note that, in the example of the radio-frequency device 10 in FIG. 12, the electronic component 100X2 has a configuration similar to that of the electronic component 100X1. Thus, description of the configuration of the electronic component 100X2 will not be repeated.

In the radio-frequency device 10, by configuring each of the electronic components 100X1 and 100X2 as described above, it is possible to realize a reduction in size and height while reducing or preventing a decrease in electric power handling performance. In addition, by providing the shield layer, electromagnetic field coupling between the first device and the second device is reduced. Furthermore, by providing the bonding members of the first device and the second device on the sides different from each other, it is possible to improve a degree of freedom in wiring design on the mounting substrate while reducing or preventing occurrence of a solder spreading.

Figure 13:
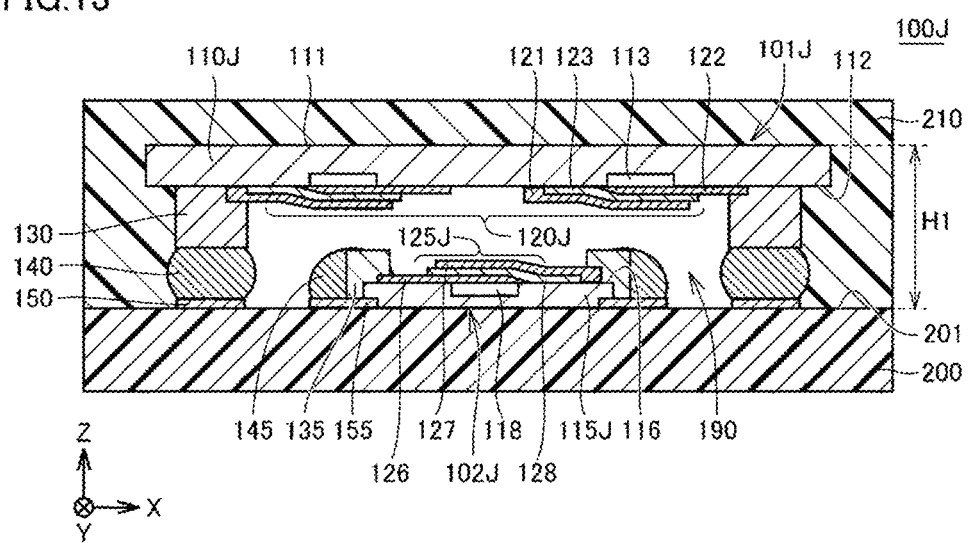
FIG. 13 is a sectional view of an electronic component according to Modified Example 3 when a BAW resonator is used as a functional element.

Note that, although the case has been described in which the SAW resonator is used as the functional element in each of the above-described preferred embodiments, another acoustic wave device such as a BAW resonator illustrated in FIG. 13 may be used, or a small sensor or actuator referred to as a micro electro mechanical system (MEMS) may be used, as for a functional element that is located in the hollow space.

In an electronic component 100J in FIG. 13, a first device 101J includes a functional element 120J defining a BAW resonator, and a second device 102J includes a functional element 125J defining a BAW resonator. In the first device 101J, a concave portion 113 is located in the lower surface 112 of a silicon substrate 110J, and a piezoelectric film 123 sandwiched between two wiring layers 121 and 122 is positioned so as to cover the concave portion 113. Similarly, in the second device 102J, a concave portion 118 is located in the upper surface 116 of a silicon substrate 115J, and a piezoelectric film 128 sandwiched between two wiring layers 126 and 127 is positioned so as to cover the concave portion 113.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component, comprising:
a mounting substrate;
a first device spaced apart from the mounting substrate and facing the mounting substrate; and
a second device located on the mounting substrate so as to face the first device; wherein
each of the first device and the second device includes a functional element;
the functional element of the first device is located on a first surface facing the second device, in the first device;
the functional element of the second device is located on a second surface facing the first device, in the second device;
the first device is connected to a first electrode on the mounting substrate via a first bonding member;
the second device is connected to a second electrode on the mounting substrate via a second bonding member; and
in a normal direction of the mounting substrate, a distance in at least a portion of the second electrode to the first surface of the first device is longer than a distance from the first electrode to the first surface of the first device.

2. A radio-frequency device defining a front-end circuit of a communication device and including the electronic component according to claim 1.

3. The electronic component according to claim 1, wherein the first bonding member is connected to a wiring pattern on the first surface of the first device, via a columnar electrode.

4. The electronic component according to claim 1, wherein the second bonding member is connected to an electrode on a side surface of the second device.

5. The electronic component according to claim 1, wherein
in the mounting substrate, a concave portion is located in a surface facing the first device; and
the second device is located in the concave portion of the mounting substrate.

6. The electronic component according to claim 5, wherein at least a portion of the second electrode is located in the concave portion.

7. The electronic component according to claim 1, wherein
in the mounting substrate, a convex portion is located on a surface facing the first device; and
the second device is located in a region surrounded by the convex portion on the mounting substrate.

8. The electronic component according to claim 7, wherein the first electrode is located on the convex portion.

9. The electronic component according to claim 1, further comprising a positioner located on the mounting substrate to position the second device.

10. The electronic component according to claim 1, wherein
each of the first device and the second device has a rectangular or substantially rectangular shape including a side parallel or substantially parallel to a first direction and a side parallel or substantially parallel to a second direction perpendicular or substantially perpendicular to the first direction, in a plan view in the normal direction of the mounting substrate;
the first bonding member is located along a side parallel or substantially parallel to the first direction, in the first device; and
the second bonding member is located along a side parallel or substantially parallel to the second direction, in the second device.

11. The electronic component according to claim 10, wherein in the plan view in the normal direction of the mounting substrate:
the side parallel or substantially parallel to the first direction in the first device is located outside a side parallel or substantially parallel to the first direction in the second device; and the side parallel or substantially parallel to the second direction in the second device is located outside a side parallel or substantially parallel to the second direction in the first device.

12. The electronic component according to claim 1, wherein at least one of the first device and the second device further includes:
    a support portion; and
    a cover portion supported by the support portion; and
    the functional element is located in a space defined by the support portion and the cover portion.

13. The electronic component according to claim 12, further comprising a shield layer on the cover portion.

14. The electronic component according to claim 1, further comprising a metal layer in contact with the second device, between the second device and the mounting substrate.

15. The electronic component according to claim 1, further comprising a seal to seal the first device and the second device.

16. The electronic component according to claim 1, wherein at least one of the functional elements includes a surface acoustic wave element.

17. The electronic component according to claim 1, wherein at least one of the functional elements includes a bulk acoustic wave element.

18. The electronic component according to claim 1, wherein at least one of the functional elements includes a micro electro mechanical system.

19. The electronic component according to claim 1, wherein the first device and the second device are positioned to define a stack structure.

* * * * *